US007456708B2

(12) United States Patent
Chou et al.

(10) Patent No.: US 7,456,708 B2
(45) Date of Patent: Nov. 25, 2008

(54) PIEZOELECTRIC PLATE ELECTRIC CONNECTION STRUCTURE

(75) Inventors: Chin-Wen Chou, Taipei Hsien (TW); Ying-Nan Cheng, Taipei Hsien (TW); Chin-Biau Chung, Taipei Hsien (TW)

(73) Assignee: Zippy Technology Corp., Taipei Hsien (TW)

( * ) Notice: Subject to any disclaimer, the term of this patent is extended or adjusted under 35 U.S.C. 154(b) by 331 days.

(21) Appl. No.: 11/368,636

(22) Filed: Mar. 7, 2006

(65) Prior Publication Data
US 2007/0210875 A1    Sep. 13, 2007

(51) Int. Cl.
H03H 9/13 (2006.01)
H03H 9/54 (2006.01)

(52) U.S. Cl. ............... 333/187; 310/357; 310/365; 310/366

(58) Field of Classification Search ............... 333/187, 333/189; 310/357, 365, 366
See application file for complete search history.

(56) References Cited

U.S. PATENT DOCUMENTS 2,323,610 A * 7/1943 Koch .................. 310/366
2,969,512 A * 1/1961 Jaffe et al. ................ 333/187
2,976,501 A * 3/1961 Mattiat ...................... 333/32
3,297,968 A * 1/1967 Fowler ...................... 333/187
3,764,848 A    10/1973 Berlincourt
5,229,680 A * 7/1993 Sato et al. ................ 310/339

FOREIGN PATENT DOCUMENTS

| JP | 62-207019 | * | 9/1987 | .......... 310/319 |
| JP | 02-082672 | * | 3/1990 | .......... 310/359 |
| JP | 10-308545 | * | 11/1998 | |
| JP | 2001-015824 | * | 1/2001 | |

OTHER PUBLICATIONS

Machine translation of the detailed description of JP 10-308545, Nov. 1998.*

* cited by examiner

*Primary Examiner*—Barbara Summons
(74) *Attorney, Agent, or Firm*—Muncy, Geissler, Olds & Lowe, PLLC

(57) ABSTRACT

A piezoelectric plate electric connection structure aims to receive an input voltage from a voltage source and goes through a polarization process to deliver an output voltage. It has an input electrode on a piezoelectric plate to receive input from the voltage source and an output electrode to deliver the output voltage that are located on two surfaces normal to the polarization direction. One surface has an independent electrode. Another surface has two separated electrodes. The input electrode and output electrode are respectively the independent electrode and one of the separated electrodes. The input and output electrodes are spaced by the piezoelectric plate which is dielectric and pressure-resistant. Thus discharge phenomenon can be prevented between the input electrode and the output electrode.

3 Claims, 3 Drawing Sheets

PIEZOELECTRIC PLATE ELECTRIC CONNECTION STRUCTURE

FIELD OF THE INVENTION

The present invention relates to a piezoelectric plate and particularly to an electric connection structure that consists of electrodes to input and output voltage on a piezoelectric plate.

BACKGROUND OF THE INVENTION

Piezoelectric phenomenon basically is an energy conversion process between mechanical energy and electric energy. As electric charges and strain have a cause and effect relationship, a substance that can generate piezoelectricity and has a crystal structure can produce an electron dipole moment when subject to an external force. Hence energy conversion between mechanical energy and electric energy occurs. This is the fundamental principle of piezoelectricity.

Generation of the electron dipole moment is caused by a special arrangement of positive ions and negative ions in a crystal. Different crystal lattice systems in materials result in generation of different electron dipole moments. The basic condition is that a crystal lattice has an asymmetric center. If a symmetrical center exists in a crystal lattice, the positive ions and the negative ions are neutralized, then the electron dipole moment does not exist, and energy conversion between the mechanic energy and electric energy does not occur. The conversion of mechanic energy and electric energy generally has three types: 1. convert mechanic energy to electric energy; 2. convert electric energy to mechanic energy; 3. convert electric energy to mechanic energy then to electric energy to be output. Piezoelectric ceramic has piezoelectric characteristics that can perform conversion between mechanic energy and electric energy, thus is widely used, such as in pressure sensing elements, speed accelerators, micro-motors and the like. Moreover, piezoelectric membrane is desirable for electronic products that demand thin and light. It can be used on electronic elements in bio-sensors and communication, hence is quite popular in academic and industrial applications.

In 1973, Berlincourt discovered a "Unipoled PZT" piezoelectric structure. By changing the thickness relationship between the output/input area and a corresponding polarization area of a piezoelectric structure, the voltage boosting and reducing ratio of the piezoelectric structure can be altered during the polarization process. However, in the conventional practice, the distance of the input and output electrodes and the ground electrode remains constant to alter the polarization area of the input and output electrodes to change the voltage boosting and reducing ratio.

U.S. Pat. No. 3,764,848 discloses a piezoelectric structure for activating a gas charge lamp. It mainly adopts the principle mentioned above, namely by changing the polarization area ratio covered by the input and output electrodes to get different output voltage boosting and reducing ratios, thereby to actuate the gas discharge lamp.

By means of the aforesaid approach, in the condition of a higher voltage boosting ratio, the input and output voltage are on the same surface. The potential difference between the input electrode and output electrode is great either in the voltage boosting or reducing condition. Located on the same surface, the input and output electrodes also cannot be spaced at a desired interval. As a result, sparking phenomenon frequently occurs between the electrodes. This easily causes rising of temperature and results in the risk of fire breakout in the surrounding environment.

SUMMARY OF THE INVENTION

Therefore the primary object of the present invention is to solve the aforesaid disadvantages. The invention provide a piezoelectric plate electric connection structure to transform a voltage boosting or reducing input to an output voltage. The piezoelectric plate has a polarization direction. On two surfaces normal to the polarization direction of the piezoelectric plate, there are an independent electrode and two separated electrodes. The two separated electrodes include a ground electrode. An input electrode is provided to receive input voltage and an output electrode is provided to deliver output voltage that are located on the same surface. Either the input or output electrode is located on the same surface where the ground electrode is located. Another electrode (either input or output electrode) is located on another opposing surface. The two electrodes are spaced by the piezoelectric plate which is dielectric and pressure-resistant. Therefore the electrodes are prevented from too close to each other, and the sparking phenomenon can be avoided.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1A:
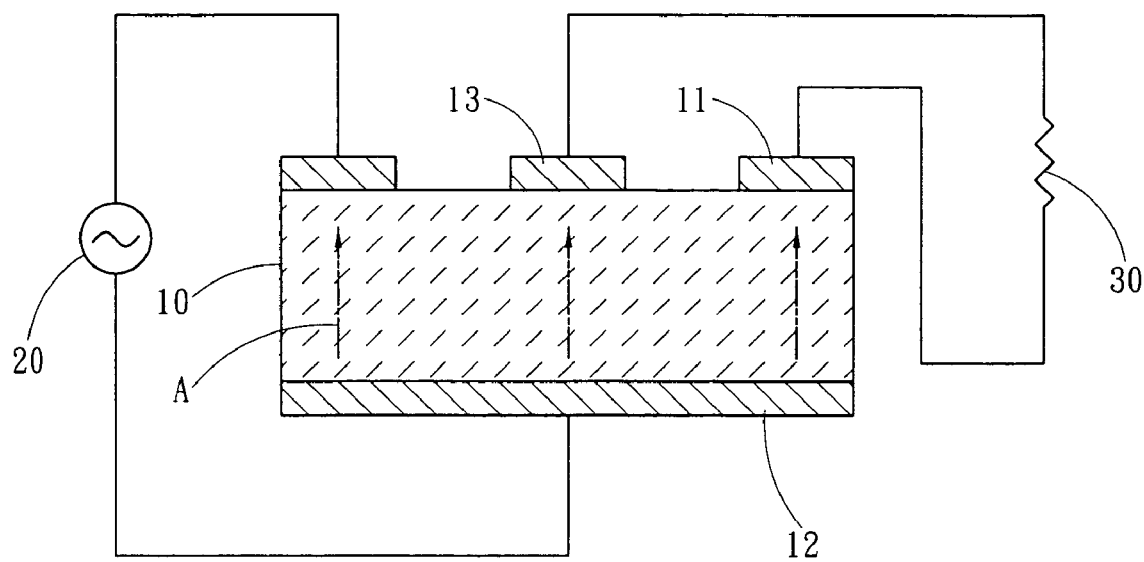
FIG. 1A is a schematic view of an embodiment of circuit connection of the present invention.
Figure 1B:
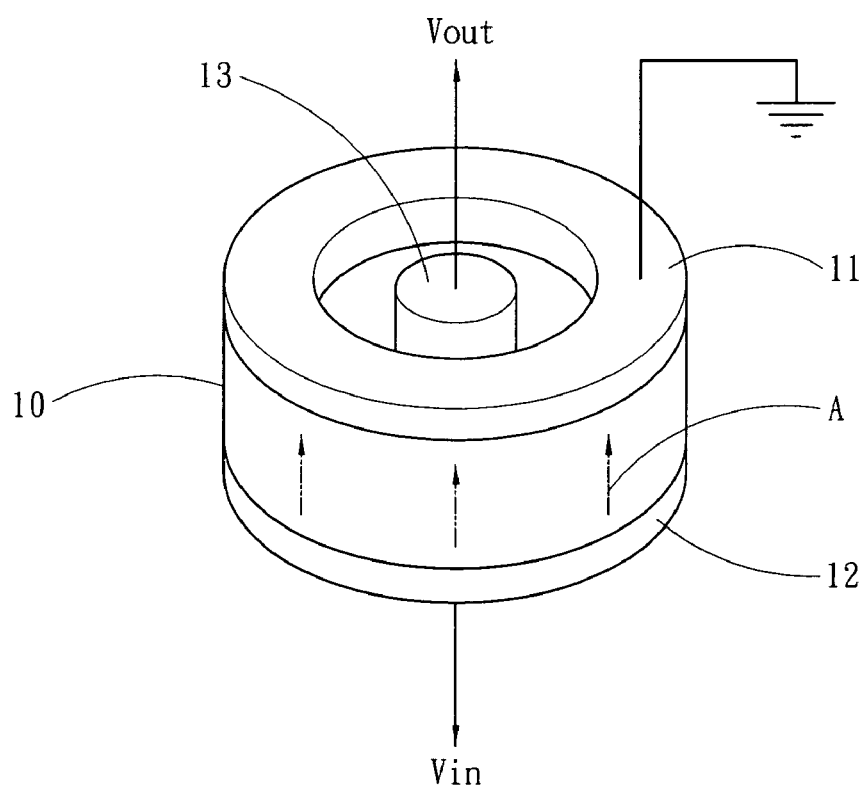
FIG. 1B is a schematic view of an embodiment of the invention.

Please refer to FIGS. 1A and 1B for schematic views of a circuit connection and an embodiment of the invention. The invention includes a piezoelectric plate 10 which is electrically connected to an input voltage source 20 to generate a boosting voltage or reducing voltage through a polarization process to be output. The piezoelectric plate 10 shown in the drawings is circular to serve as an example. It has an input electrode 12 electrically connected to the input voltage source and an output electrode 13 to output a polarized voltage to a load 30, and a ground electrode 11 which is electrically connected to the voltage source 20 and the load 30. The piezoelectric plate 10 adopts the principle previously discussed, and forms a voltage difference between the input electrode 12 and the output electrode 13 after having received the input voltage.

Figure 2:
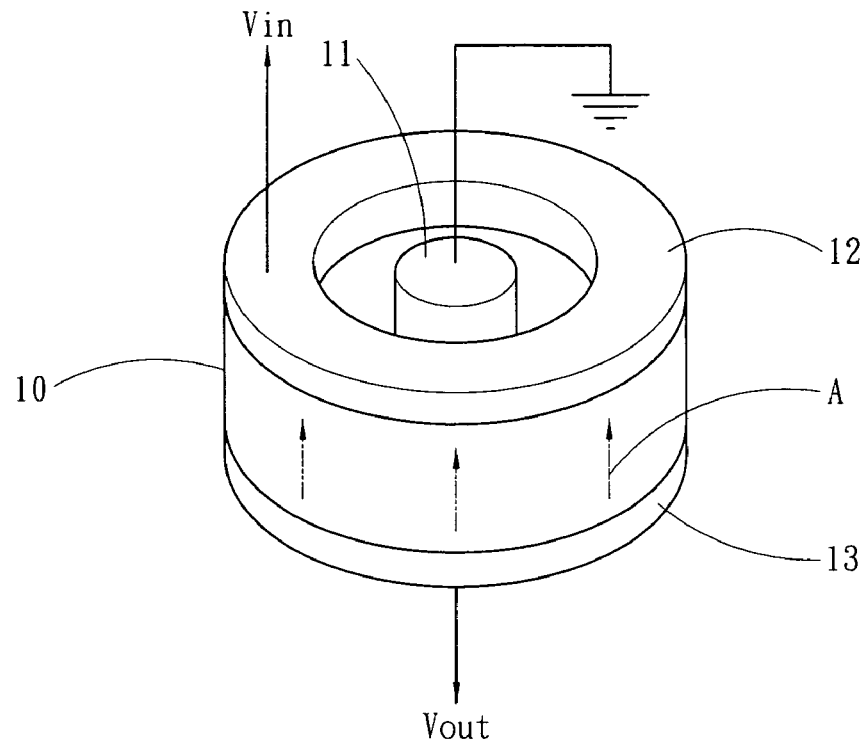
FIG. 2 is a schematic view of another embodiment of the invention.
Figure 3:
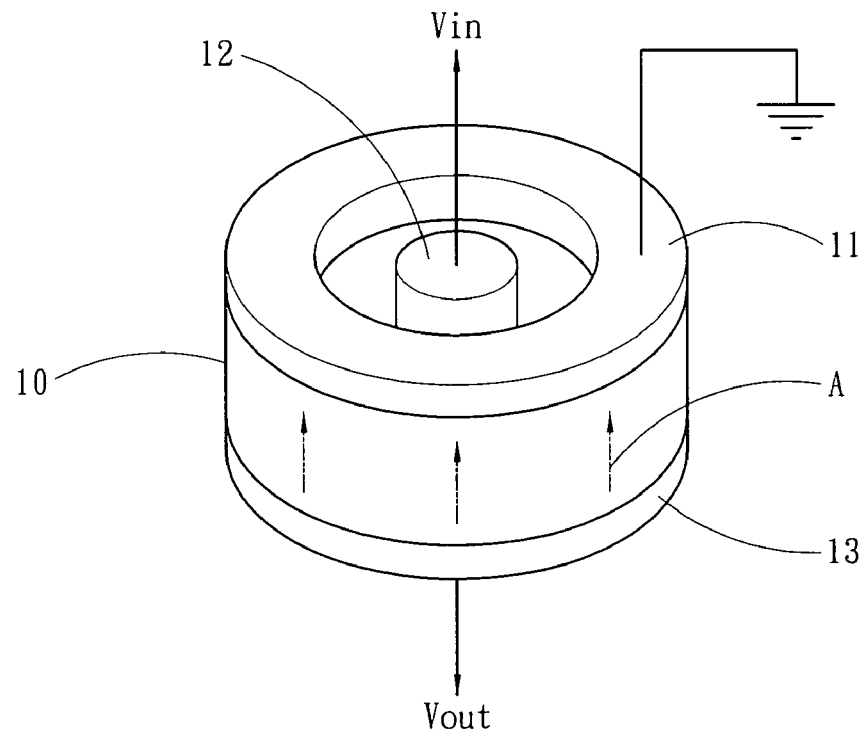
FIG. 3 is a schematic view of yet another embodiment of the invention.
Figure 4:
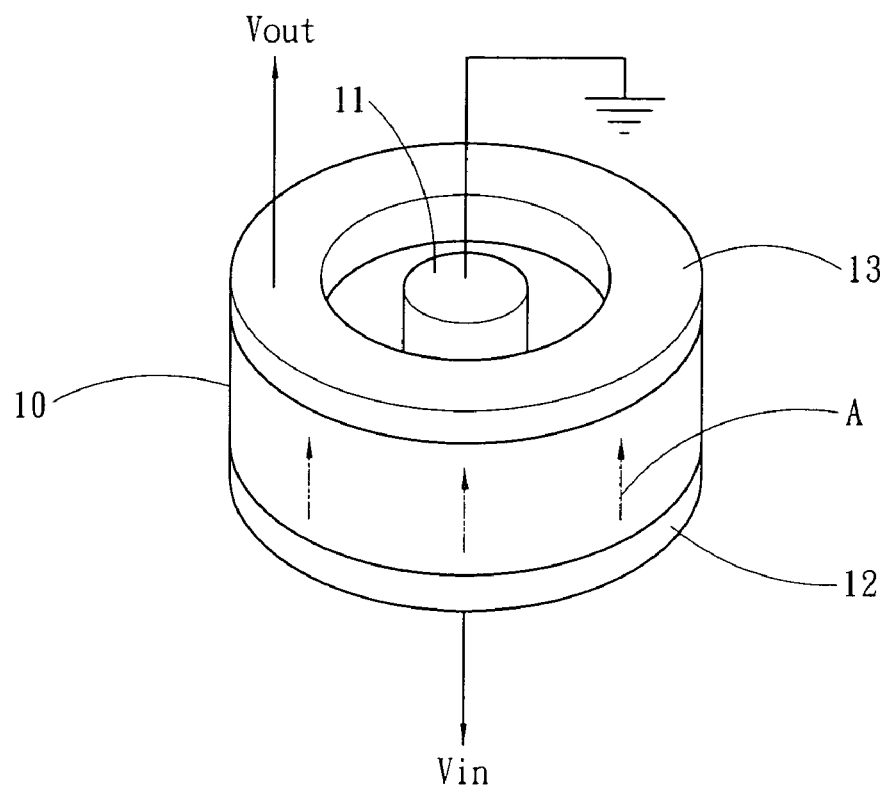
FIG. 4 is a schematic view of still another embodiment of the invention.

Adopted the "Unipoled PZT" piezoelectric structure taught by Berlincourt that requires a change of the thickness relationship of the output/input area and the corresponding polarization area of the piezoelectric structure, the piezoelectric plate 10 should have a selected thickness to generate a corresponding change on the output voltage. Hence on the piezoelectric plate 10 two surfaces are formed normal to the polarization direction A to hold electrodes. The circular piezoelectric plate 10 is sandwiched between the two surfaces at a sufficient thickness. The invention aims to change the location of the electrodes on the piezoelectric plate 10. On the two surfaces of the piezoelectric plate 10 in the same polarization direction, there are an independent electrode and two separated concentric annular electrodes to serve respectively as the input electrode 12, output electrode 13 and ground electrode 11. The input and output electrodes 12 and 13 are located respectively on the independent electrode and separated electrode. Referring to FIGS. 1A and 1B, the inner annular electrode is the output electrode 13, the outer annular electrode is the ground electrode 11. The independent electrode 12 is the input electrode 12. It is a feature of the invention to position the independent electrode and the separated electrodes on two different surfaces. Hence the input electrode 12 and output electrode 13 are spaced from each other by the piezoelectric plate 10 which is dielectric and pressure-resistant. Refer to FIGS. 2, 3 and 4 for other embodiments of the invention that also adopt the same principle. In FIG. 2, the input electrode 12 is the outer annular electrode, the ground electrode 11 is the inner annular electrode, and the output electrode 13 is the independent electrode located on another surface. In FIG. 3, the input electrode 12 is the inner annular electrode, the ground electrode 11 is the outer annular electrode, and the output electrode 13 is the independent electrode located on another surface. In FIG. 4, the ground electrode 11 is the inner annular electrode, the output electrode 13 is the outer annular electrode, and the input electrode 12 is the independent electrode located on another surface.

Figure 5:
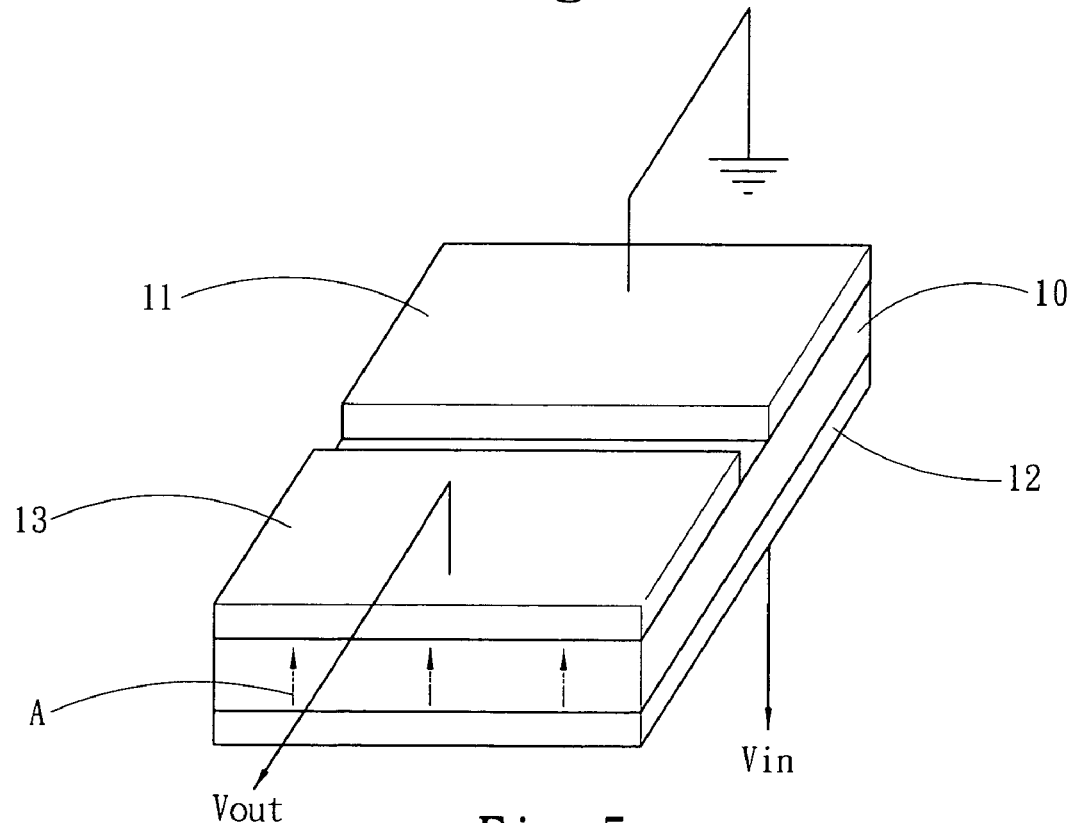
FIG. 5 is a perspective view of a further embodiment of the present invention.

In short, the invention has the output electrode 13 and input electrode 12 spaced by the piezoelectric plate 10. The piezoelectric plate 10 is not limited to circular, or the electrodes on the same surface are not necessary to be concentric. Different shapes of the piezoelectric plate 10 can be used. The ground electrode 11, input electrode 12 (or output electrode 13) may be formed in other configurations different from the concentric ones previously discussed. FIG. 5 illustrates a further embodiment in which the piezoelectric plate 10 has a rectangular body, the ground electrode 11 and input electrode 12 are located respectively on two ends of one surface of the rectangular body, and the independent electrode is located on another surface of the rectangular body. It can function equally well. The feature of the invention is that: the input electrode 12 and the output electrode 13 are located on two surfaces normal to the polarization direction A. The input electrode 12 and output electrode 13 are spaced by the piezoelectric plate 10 that is dielectric and pressure-resistant. Hence sparking phenomenon between the input electrode 12 and the output electrode 13 caused by voltage difference can be prevented.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A piezoelectric plate electric connection structure, comprising:
    a piezoelectric plate,
    an independent electrode and two separated electrodes located on two opposing surfaces of the piezoelectric plate, one of the three electrodes is a ground electrode to be electrically connected to a voltage source which provides voltage input and a load, another electrode is an input electrode electrically connecting to the voltage source, and yet another electrode is an output electrode electrically connecting to the load,
    the voltage source providing an input voltage which is transformed in a same polarization direction through the thickness spaced between the two surfaces of the piezoelectric plate to form a boosting or reducing output voltage to supply the load;
    the ground electrode being one of the two separated electrodes, and
    the input electrode and the output electrode being located respectively on the opposing two surfaces and being the independent electrode and another electrode of the two separated electrodes.

2. The piezoelectric plate electric connection structure of claim 1, wherein the input electrode is one of the two separated electrodes and the output electrode is the independent electrode.

3. The piezoelectric plate electric connection structure of claim 1, wherein the output electrode is one of the two separated electrodes and the input electrode is the independent electrode.

* * * * *